United States Patent
Desai et al.

(10) Patent No.: US 7,678,700 B2
(45) Date of Patent: Mar. 16, 2010

(54) SILICON CARBIDE POLISHING METHOD UTILIZING WATER-SOLUBLE OXIDIZERS

(75) Inventors: Mukesh Desai, Naperville, IL (US); Kevin Moeggenborg, Naperville, IL (US); Phillip Carter, Round Lake, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 11/515,546

(22) Filed: Sep. 5, 2006

(65) Prior Publication Data

US 2008/0057713 A1 Mar. 6, 2008

(51) Int. Cl.
*H01L 21/302* (2006.01)
*H01L 21/461* (2006.01)

(52) U.S. Cl. .................. 438/689; 438/691; 438/692; 438/693

(58) Field of Classification Search .............. 438/690, 438/691, 692, 693; 252/79.1, 79.5
See application file for complete search history.

(56) References Cited

U.S. PATENT DOCUMENTS

| | | | |
|---|---|---|---|
| 4,657,754 A | 4/1987 | Bauer et al. | |
| 5,227,104 A | 7/1993 | Bauer | |
| 5,230,833 A | 7/1993 | Romberger et al. | |
| 5,389,194 A | 2/1995 | Rostoker et al. | |
| 5,525,191 A | 6/1996 | Maniar et al. | |
| 5,607,718 A | 3/1997 | Sasaki et al. | |
| 5,750,434 A * | 5/1998 | Urushidani et al. | 438/478 |
| 5,775,980 A | 7/1998 | Sasaki et al. | |
| 5,858,813 A * | 1/1999 | Scherber et al. | 438/693 |
| 5,897,375 A | 4/1999 | Watts et al. | |
| 6,001,730 A | 12/1999 | Farkas et al. | |
| 6,177,026 B1 | 1/2001 | Wang et al. | |
| 6,221,775 B1 | 4/2001 | Ference et al. | |
| 6,258,137 B1 | 7/2001 | Garg et al. | |
| 6,274,478 B1 | 8/2001 | Farkas et al. | |
| 6,346,741 B1 | 2/2002 | Van Buskirk et al. | |
| 6,347,978 B1 * | 2/2002 | Fang et al. | 451/28 |
| 6,348,395 B1 | 2/2002 | Clevenger et al. | |
| 6,444,569 B2 | 9/2002 | Farkas et al. | |
| 6,488,570 B1 | 12/2002 | James et al. | |
| 6,488,767 B1 | 12/2002 | Xu et al. | |
| 6,521,535 B2 | 2/2003 | Sabia | |
| 6,548,399 B1 | 4/2003 | Andideh et al. | |
| 6,555,476 B1 | 4/2003 | Olsen et al. | |
| 6,612,911 B2 | 9/2003 | Carter et al. | |
| 6,623,331 B2 | 9/2003 | Sevilla et al. | |
| 6,630,390 B2 | 10/2003 | Andideh et al. | |
| 6,685,540 B2 | 2/2004 | Cherian et al. | |
| 6,726,534 B1 | 4/2004 | Bogush et al. | |
| 6,811,474 B2 | 11/2004 | Cherian et al. | |
| 6,821,309 B2 | 11/2004 | Singh et al. | |
| 6,841,479 B2 | 1/2005 | Cherian et al. | |
| 6,849,099 B2 | 2/2005 | Ohno et al. | |
| 6,916,742 B2 | 7/2005 | Ye et al. | |
| 6,946,397 B2 | 9/2005 | Hong et al. | |
| 6,998,166 B2 | 2/2006 | Prasad | |
| 2002/0197935 A1 | 12/2002 | Mueller et al. | |
| 2003/0124850 A1 * | 7/2003 | Minamihaba et al. | 438/689 |
| 2003/0139069 A1 * | 7/2003 | Block et al. | 438/962 |
| 2003/0157804 A1 * | 8/2003 | Puppe et al. | 438/692 |
| 2003/0178320 A1 * | 9/2003 | Liu et al. | 205/640 |
| 2004/0171265 A1 | 9/2004 | Ye et al. | |
| 2004/0250476 A1 | 12/2004 | Ohno et al. | |
| 2005/0126588 A1 | 6/2005 | Carter et al. | |
| 2005/0194358 A1 | 9/2005 | Chelle | |
| 2005/0218010 A1 | 10/2005 | Wang et al. | |
| 2006/0006074 A1 | 1/2006 | Liu et al. | |
| 2006/0108325 A1 * | 5/2006 | Everson et al. | 216/88 |

FOREIGN PATENT DOCUMENTS

| | | |
|---|---|---|
| EP | 0 495 787 B1 | 7/1992 |
| KR | 10-2004-032052 A | 4/2004 |
| WO | WO 91/06116 A1 | 5/1991 |

OTHER PUBLICATIONS

Zhou et al. J. Electrochem. Soc. vol. 144, No. 6, Jun. 1997.*
Hawkey's "Condensed Chemical Dictionary", Thirteenth Edition, 1997, p. 997.*
Li et al., "Electro-Chemical Mechanical Polishing of Silicon Carbide," *Journal of Electronic Materials*, 33(5): 481-486 (May 2004).
Lin et al., "A Study on Surface Polishing of SiC with a Tribochemical Reaction Mechanism," *Int. J. Adv. Manufacturing Technology*, 25: 33-40 (2005).
Neslen et al., "Effects of Process Parameter Variations on the Removal Rate in Chemical Mechanical Polishing of 4H-SiC," *Journal of Electronic Materials*, 30(10): 1271-1275 (Oct. 2001).
Zhou et al., "Chemomechanical Polishing of Silicon Carbide," *Journal of the Electrochemical Society* 144(6): L161-L163 (Jun. 1997).
Chichignoud et al., *Materials Science Forum 527-529:* 71-74 (2006).
Kamitani et al., *J. Appl. Phys.* 82(6): 3152-3154 (Sep. 15, 1997).

* cited by examiner

*Primary Examiner*—Duy-Vu N Deo
(74) *Attorney, Agent, or Firm*—Thomas E. Omholt; Nancy J. Gettel; Steven D. Waseman

(57) ABSTRACT

The inventive method comprises chemically-mechanically polishing a substrate comprising at least one layer of silicon carbide with a polishing composition comprising a liquid carrier, an abrasive, and an oxidizing agent.

23 Claims, No Drawings

SILICON CARBIDE POLISHING METHOD UTILIZING WATER-SOLUBLE OXIDIZERS

FIELD OF THE INVENTION

This invention pertains to a method of polishing a silicon carbide substrate.

BACKGROUND OF THE INVENTION

Semiconductors with the ability to operate more efficiently in order to achieve a significant reduction in power consumption are highly desirable. Typically, silicon substrates are used in the manufacture of such devices, however, further development is limited due to the inherent characteristics of silicon. Development of the next generation of semiconductor devices has emphasized the use of materials having a greater hardness and other unique properties. For example, silicon carbide, when compared with silicon oxide, has a higher thermal conductivity, a greater tolerance for radiation, a higher dielectric strength, and is able to withstand greater temperatures, which makes it suitable for a variety of applications. The use of silicon carbide has been limited, however, by semiconductor fabrication technology.

In order to produce silicon carbide semiconductors, the surfaces of the silicon carbide substrates must be polished in order to provide smooth surfaces and to obtain precise dimensions for the surfaces. The properties which make silicon carbide such a useful substrate provide unique challenges in the polishing process. Due to the hardness of silicon carbide, diamond grit is typically used to mechanically polish silicon carbide substrates.

Chemical-mechanical polishing (CMP) techniques are widely used throughout the semiconductor industry in order to polish the current generation of silicon devices. CMP involves the use of a polishing composition (also known as a polishing slurry) containing an abrasive and an aqueous material, which is applied to a surface by contacting the surface with a polishing pad saturated with the polishing composition. The polishing composition may also contain an oxidizing agent, which allows for less aggressive mechanical abrasion of the substrate, thus reducing mechanical damage to the substrate caused by the abrading process. The use of such techniques to polish silicon carbide substrates could greatly reduce the costs of manufacturing semiconductors by decreasing polish time and reducing damage to the substrate.

Adaptation of CMP techniques for silicon carbide polishing has been relatively unsuccessful. Polishing compositions containing colloidal silica resulted in low silicon carbide removal rates, thus requiring a lengthy polishing cycle lasting several hours at temperatures of around 50° C., which is likely to result in damage to the silicon carbide substrate. Zhou, et al., *J. Electrochemical Soc.*, 144, p. L161-L163 (1997); Neslen, et al., *J. Electronic Materials*, 30, p. 1271-1275 (2001). The long polishing cycle adds considerable cost to the process and is a barrier preventing widespread use of silicon carbide within the semiconductor industry. Thus, there remains a need for alternative polishing systems and methods of polishing substrates comprising silicon carbide.

BRIEF SUMMARY OF THE INVENTION

The invention provides a method of chemically-mechanically polishing a substrate, which method comprises (i) contacting a substrate comprising at least one layer of single crystal silicon carbide with a chemical-mechanical polishing composition comprising (a) a liquid carrier, (b) an abrasive suspended in the liquid carrier, wherein the abrasive is substantially spherical silica particles having an average particle size of about 40 nm to about 130 nm, and (c) an oxidizing agent selected from the group consisting of hydrogen peroxide, oxone, ammonium cerium nitrate, periodates, iodates, persulfates, and mixtures thereof, (ii) moving the polishing composition relative to the substrate, and (iii) abrading at least a portion of the silicon carbide of the substrate to polish the substrate.

The invention further provides a method of chemically-mechanically polishing a substrate, which method comprises (i) contacting a substrate comprising at least one layer of single crystal silicon carbide with a chemical-mechanical polishing composition comprising (a) a liquid carrier, (b) an abrasive suspended in the liquid carrier, wherein the abrasive is alumina and is present in an amount of about 3 wt. % or less based on the weight of the liquid carrier and any components dissolved or suspended therein, and (c) an oxidizing agent, wherein the oxidizing agent is present in an amount of about 0.001 wt. % to about 0.5 wt. % based on the weight of the liquid carrier and any components dissolved or suspended therein, and is selected from the group consisting of hydrogen peroxide, oxone, ammonium cerium nitrate, periodates, iodates, persulfates, and mixtures thereof, and (ii) moving the polishing composition relative to the substrate, and (iii) abrading at least a portion of the silicon carbide of the substrate to polish the substrate.

The invention also provides a method of chemically-mechanically polishing a substrate, which method comprises (i) contacting a substrate comprising at least one layer of silicon carbide with a chemical-mechanical polishing composition comprising (a) a liquid carrier, (b) an abrasive suspended in the liquid carrier, and (c) an oxidizing agent, wherein the oxidizing agent is present in an amount of about 0.001 wt. % to about 0.5 wt. % based on the weight of the liquid carrier and any components dissolved or suspended therein, and is selected from the group consisting of oxone, potassium persulfate, and mixtures thereof (ii) moving the polishing composition relative to the substrate, and (iii) abrading at least a portion of the silicon carbide of the substrate to polish the substrate.

DETAILED DESCRIPTION OF THE INVENTION

The invention provides a method of chemically-mechanically polishing a substrate comprising silicon carbide. The method comprises (i) contacting a substrate comprising at least one layer of single crystal silicon carbide, (ii) moving the polishing composition relative to the substrate, and (iii) abrading at least a portion of the silicon carbide of the substrate to polish the substrate. The polishing composition comprises, consists essentially of, or consists of (a) a liquid carrier, (b) an abrasive suspended in the liquid carrier, and (c) an oxidizing agent.

In a first embodiment, the abrasive is substantially spherical silica particles having an average particle size of about 40 nm to about 130 nm, and the oxidizing agent is selected from the group consisting of hydrogen peroxide, oxone, ammonium cerium nitrate, periodates, iodates, persulfates, and mixtures thereof. In a second embodiment, the abrasive is alumina and is present in an amount of about 3 wt. % or less based on the weight of the liquid carrier and any components dissolved or suspended therein, and the oxidizing agent is present in an amount of about 0.001 wt. % to about 0.5 wt. % based on the weight of the liquid carrier and any components dissolved or suspended therein, and is selected from the group consisting of hydrogen peroxide, oxone, ammonium cerium nitrate, periodates, iodates, persulfates, and mixtures thereof. In a third embodiment, the oxidizing agent is present in an amount of about 0.001 wt. % to about 0.5 wt. % based on the weight of the liquid carrier and any components dissolved or suspended therein, and is selected from the group consisting of oxone, potassium persulfate, and mixtures thereof.

The substrate to be polished using the method of the invention can be any suitable substrate which comprises at least one layer of silicon carbide. Suitable substrates include, but are not limited to, flat panel displays, integrated circuits, memory or rigid disks, metals, interlayer dielectric (ILD) devices, semiconductors, micro-electro-mechanical systems, ferroelectrics, and magnetic heads. The silicon carbide can comprise, consist essentially of, or consist of any suitable silicon carbide, many of which are known in the art. The silicon carbide can be single crystal or polycrystalline. Silicon carbide has many different types of crystal structures, each having its own distinct set of electronic properties. Only a small number of these polytypes, however, can be reproduced in a form acceptable for use as semiconductors. Such polytypes can be either cubic (e.g., 3C silicon carbide) or non-cubic (e.g., 4H silicon carbide, 6H silicon carbide). The properties of these polytypes are well known in the art.

The polishing pad can be any suitable polishing pad, many of which are known in the art. Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The polishing pad can comprise fixed abrasive particles on or within the polishing surface of the polishing pad, or the polishing pad can be substantially free of fixed abrasive particles. Fixed abrasive polishing pads include pads having abrasive particles affixed to the polishing surface of the polishing pad by way of an adhesive, binder, ceramer, resin, or the like or abrasives that have been impregnated within a polishing pad so as to form an integral part of the polishing pad, such as, for example, a fibrous batt impregnated with an abrasive-containing polyurethane dispersion.

The polishing pad can have any suitable configuration. For example, the polishing pad can be circular and, when in use, typically will have a rotational motion about an axis perpendicular to the plane defined by the surface of the pad. The polishing pad can be cylindrical, the surface of which acts as the polishing surface, and, when in use, typically will have a rotational motion about the central axis of the cylinder. The polishing pad can be in the form of an endless belt, which, when in use, typically will have a linear motion with respect to the cutting edge being polished. The polishing pad can have any suitable shape and, when in use, have a reciprocating or orbital motion along a plane or a semicircle. Many other variations will be readily apparent to the skilled artisan.

The polishing composition comprises an abrasive, which desirably is suspended in the liquid carrier (e.g., water). The abrasive typically is in particulate form. In particular, the abrasive comprises, consists essentially of, or consists of substantially spherical silica or alumina. Substantially spherical silica is also referred to as colloidal silica by those of ordinary skill in the art. Preferably, the substantially spherical silica is precipitated or condensation-polymerized silica, which is prepared using the sol-gel process. Condensation-polymerized silica particles typically are prepared by condensing $Si(OH)_4$ to form substantially spherical particles. The precursor $Si(OH)_4$ can be obtained, for example, by hydrolysis of high purity alkoxysilanes, or by acidification of aqueous silicate solutions. Such abrasive particles can be prepared in accordance with U.S. Pat. No. 5,230,833 or can be obtained as any of various commercially available products such as Bindzil from EKA Chemicals, the Fuso PL-1, PL-2, and PL-3 products, and the Nalco 1034A, 1050, 2327, and 2329 products, as well as other similar products available from DuPont, Bayer, Applied Research, Nissan Chemical, and Clariant. Preferably, the alumina is seeded gel process alpha alumina, which is available from manufactures such as Saint Gobain (alpha alumina). The substantially spherical silica particles and the alumina particles can have any suitable particle size. For example, the substantially spherical silica particles and the alumina particles can have an average particle size of about 10 nm or more (e.g., about 20 nm or more, about 30 nm or more, about 40 nm or more, or about 50 nm or more). The substantially spherical silica particles and the alumina particles can have an average particle size of about 200 nm or less (e.g., about 180 nm or less, about 170 nm or less, about 160 nm or less, about 150 nm or less, about 130 nm or less, about 110 nm or less, or about 100 nm or less). Accordingly, the substantially spherical silica particles and the alumina particles can have an average particle size of about 40 nm to about 130 nm (e.g., about 45 nm to about 125 nm, about 50 nm to about 120 nm, about 55 nm to about 115 nm, or about 60 nm to about 110 nm). The particle size of a particle is the diameter of the smallest sphere that encompasses the particle.

Any suitable amount of abrasive can be present in the polishing composition. Typically, about 0.01 wt. % or more (e.g., about 0.05 wt. % or more) abrasive will be present in the polishing composition. More typically, about 0.1 wt. % or more (e.g., about 1 wt. % or more, about 5 wt. % or more, about 7 wt. % or more, about 10 wt. % or more, or about 12 wt. % or more) abrasive will be present in the polishing composition. The amount of abrasive in the polishing composition typically will be about 50 wt. % or less, more typically will be about 40 wt. % or less (e.g., about 15 wt. % or less, about 10 wt. % or less, about 5 wt. % or less, about 3 wt. % or less, about 1 wt. % or less, about 0.6 wt. % or less, or about 0.3 wt. % or less). Accordingly, the amount of abrasive in the polishing composition can be about 2 wt. % to about 50 wt. %, and more preferably about 5 wt. % to about 40 wt. % (e.g., about 10 wt. % to about 35 wt. %, about 15 wt. % to about 35 wt. %, or about 20 wt. % to about 35 wt. %).

A liquid carrier is used to facilitate the application of the abrasive and any optional additives to the surface of a suitable substrate to be polished (e.g., planarized). The liquid carrier can be any suitable liquid, e.g., solvent, including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The polishing composition comprises an oxidizing agent, which can be any suitable oxidizing agent for one or more materials of the substrate to be polished with the polishing composition. Preferably, the oxidizing agent is selected from the group consisting of hydrogen peroxide, oxone, ammonium cerium nitrate, periodates, iodates, persulfates, and mixtures thereof. The periodates, iodates, and persulfates can be any periodate, iodate, persulfate or combination of periodates, iodates, and persulfates, such as, for example, potassium periodate, potassium iodate, ammonium persulfate, potassium persulfate, or sodium persulfate. More preferably, the oxidizing agent is oxone or potassium persulfate. The oxidizing agent can be present in the polishing composition in any suitable amount. Typically, the polishing composition comprises about 0.001 wt. % or more (e.g., about 0.005 wt. % or more, about 0.01 wt. % or more, about 0.05 wt. % or more, or about 0.1 wt. % or more) oxidizing agent. The polishing composition preferably comprises about 20 wt. % or less (e.g., about 15 wt. % or less, about 10 wt. % or less, about 5 wt. % or less, about 2 wt. % or less, or about 0.5 wt. % or less) oxidizing agent. Preferably, the polishing composition comprises about 0.001 wt. % to about 20 wt. % (e.g., about 0.001 wt. % to about 15 wt. %, about 0.005 wt. % to about 10 wt. %, about 0.01 wt. % to about 5 wt. %, or about 0.05 wt. % to about 2 wt. %) oxidizing agent. More preferably, the polishing composition comprises about 0.001 wt. % to about 0.05 wt. %, about 0.001 wt. % to about 0.1 wt. %, about 0.001 wt. % to about 0.5 wt. %, or about 0.001 wt. % to about 2 wt. % oxidizing agent.

The polishing composition, specifically the liquid carrier with any components dissolved or suspended therein, can have any suitable pH. The actual pH of the polishing composition will depend, in part, on the type of substrate being polished. The polishing composition can have a pH of about 11 or less (e.g., about 9 or less, about 7 or less, about 5 or less, about 4 or less, about 3 or less, or about 2 or less). The polishing composition can have a pH of about 1 or more (e.g., about 4 or more, about 6 or more, about 8 or more, or about 9 or more). The pH can be, for example, from about 1 to about 11 (e.g., from about 2 to about 10, from about 3 to about 9, from about 4 to about 8, or from about 5 to about 7).

The pH of the polishing composition can be achieved and/or maintained by any suitable means. More specifically, the polishing composition can further comprise a pH adjustor, a pH buffering agent, or a combination thereof. The pH adjustor can comprise, consist essentially of, or consist of any suitable pH-adjusting compound. For example, the pH adjustor can be any suitable acid, such as an inorganic or an organic acid, or combination thereof. For example, the acid can be nitric acid. The pH buffering agent can be any suitable buffering agent, for example, phosphates, acetates, borates, sulfonates, carboxylates, ammonium salts, and the like. The polishing composition can comprise any suitable amount of a pH adjustor and/or a pH buffering agent, provided such amount is sufficient to achieve and/or maintain the desired pH of the polishing composition, e.g., within the ranges set forth herein.

The polishing composition optionally comprises a chelating or complexing agent. The complexing agent is any suitable chemical additive that enhances the removal rate of the substrate layer being removed, or that removes trace metal contaminants in silicon polishing. Suitable chelating or complexing agents can include, for example, carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, oxalic acid, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like), polyphosphonates such as Dequest 2010, Dequest 2060, or Dequest 2000 (available from Solutia Corp.), and amine-containing compounds (e.g., ammonia, amino acids, amino alcohols, di-, tri-, and polyamines, and the like).

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof; perchlorates include the corresponding acid (i.e., perchloric acid), as well as salts thereof. Furthermore, certain compounds or reagents may perform more than one function. For example, some compounds can function both as a chelating agent and an oxidizing agent (e.g., such as iron (II) nitrate, iron (III) nitrate, and the like).

The polishing composition optionally further comprises one or more other additives. Such additives include acrylates comprising one or more acrylic subunits (e.g., vinyl acrylates and styrene acrylates), and polymers, copolymers, and oligomers thereof, and salts thereof.

The polishing composition can comprise a surfactant and/or rheological control agent, including viscosity enhancing agents and coagulants (e.g., polymeric rheological control agents, such as, for example, urethane polymers). Suitable surfactants can include, for example, cationic surfactants, anionic surfactants, nonionic surfactants, amphoteric surfactants, mixtures thereof, and the like. Preferably, the polishing composition comprises a nonionic surfactant. An example of a suitable nonionic surfactant is an ethylenediamine polyoxyethylene surfactant. The amount of surfactant in the polishing composition typically is about 0.0001 wt. % to about 1 wt. % (preferably about 0.001 wt. % to about 0.1 wt. % and more preferably about 0.005 wt. % to about 0.05 wt. %).

The polishing composition can comprise an antifoaming agent. The antifoaming agent can be any suitable anti-foaming agent. Suitable antifoaming agents include, but are not limited to, silicon-based and acetylenic diol-based antifoaming agents. The amount of anti-foaming agent in the polishing composition typically is about 10 ppm to about 140 ppm.

The polishing composition can comprise a biocide. The biocide can be any suitable biocide, for example, an isothiazolinone biocide. The amount of biocide in the polishing composition typically is about 1 to about 50 ppm, preferably about 10 to about 20 ppm.

The polishing composition preferably is colloidally stable. The term colloid refers to the suspension of the particles in the liquid carrier. Colloidal stability refers to the maintenance of that suspension through time. A polishing composition is considered colloidally stable if, when the polishing composition is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the polishing composition ([C] in terms of g/ml) is less than or equal to 0.5 (i.e., $\{[B]-[T]\}/[C] \leq 0.5$). Preferably, the value of $[B]-[T]/[C]$ is less than or equal to 0.3, more preferably is less than or equal to 0.01, even more preferably is less than or equal to 0.05, and most preferably is less than or equal to 0.01.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., oxidizing agent, abrasive, etc.) as well as any combination of ingredients (e.g., water, halogen anion, surfactants, etc.).

The polishing composition can be supplied as a one-package system comprising the liquid carrier, the abrasive, the oxidizing agent, and optionally other additives. Alternatively, some of the components, such as an oxidizing agent, can be supplied in a first container, either in dry form, or as a solution or dispersion in the liquid carrier, and the remaining components, such as the abrasive and other additives, can be supplied in a second container or multiple other containers. Other two-container, or three or more container combinations of the components of the polishing composition are within the knowledge of one of ordinary skill in the art.

Solid components, such as the abrasive, can be placed in one or more containers either in dry form or as a solution in the liquid carrier. Moreover, it is suitable for the components in the first, second, or other containers to have different pH values, or alternatively to have substantially similar, or even equal, pH values. The components of the polishing composition can be partially or entirely supplied separately from each other and can be combined, e.g., by the end-user, shortly before use (e.g., 1 week or less prior to use, 1 day or less prior to use, 1 hour or less prior to use, 10 minutes or less prior to use, or 1 minute or less prior to use).

The polishing composition also can be provided as a concentrate which is intended to be diluted with an appropriate amount of liquid carrier prior to use. In such an embodiment, the polishing composition concentrate can comprise a liquid carrier and optionally other components in amounts such that, upon dilution of the concentrate with an appropriate amount of liquid carrier, each component will be present in the polishing composition in an amount within the appropriate range recited above for each component. For example, each component can be present in the concentrate in an amount that is about 2 times (e.g., about 3 times, about 4 times, or about 5 times) greater than the concentration recited above for each component in the polishing composition so that, when the concentrate is diluted with an appropriate volume of liquid carrier (e.g., an equal volume of liquid carrier, 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the other components of the polishing composition are at least partially or fully dissolved or suspended in the concentrate.

The inventive method of polishing a substrate is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition (which generally is disposed between the substrate and the polishing pad), with the polishing pad moving relative to the substrate, so as to abrade at least a portion of the substrate to polish the substrate.

Desirably, the polishing end-point is determined by monitoring the weight of the silicon carbide substrate, which is used to compute the amount silicon carbide removed from the substrate. Such techniques are well known in the art.

Polishing refers to the removal of at least a portion of a surface to polish the surface. Polishing can be performed to provide a surface having reduced surface roughness by removing gouges, crates, pits, and the like, but polishing also can be performed to introduce or restore a surface geometry characterized by an intersection of planar segments.

The method of the invention can be used to polish any suitable substrate comprising at least one layer of silicon carbide. The silicon carbide can be removed at any suitable rate to effect polishing of the substrate. For example, silicon carbide can be removed at a rate of about 5 nm/hr or more (e.g., about 10 nm/hr or more, about 20 nm/hr or more, about 50 nm/hr or more, about 70 nm/hr or more, about 100 nm/hr or more, or about 200 nm/hr or more). The silicon carbide can be removed at a rate of about 800 nm/hr or less (e.g., about 500 nm/hr or less, about 300 nm/hr or less, about 250 nm/hr or less, or about 200 nm/hr or less). Accordingly, the silicon carbide can be removed from the substrate at a rate of about 5 nm/hr to about 1500 nm/hr (e.g., about 10 nm/hr to about 1000 nm/hr, about 20 nm/hr to about 800 nm/hr, about 30 nm/hr to about 500 nm/hr, about 40 nm/hr to about 300 nm/hr, or about 50 nm/hr to about 180 nm/hr). More preferably, the silicon carbide can be removed from the substrate at a rate of about 20 nm/hr to about 180 nm/hr, about 70 nm/hr to about 180 nm/hr, about 100 nm/hr to about 180 nm/hr, about 30 nm/hr to about 1000 nm/hr, about 100 nm/hr to about 500 nm/hr, or about 200 nm/hr to about 400 nm/hr.

The following examples further illustrate the invention but, of course, should not be construed as in any way limiting its scope.

EXAMPLE 1

This example demonstrates the effect on the removal rate of silicon carbide by the presence of substantially spherical silica and an oxidizer in a polishing composition.

A 6H semi-insulating single crystal silicon carbide wafer was polished with ten different polishing compositions. The contents and pH of each of the polishing compositions are indicated in Table 1. The silicon carbide removal rate (nm/hr) was determined for each polishing composition, and the results are shown in Table 1.

TABLE 1

| Polishing Composition | Abrasive Concentration | Oxidizer Concentration | pH | Silicon Carbide Removal Rate (nm/hr) |
|---|---|---|---|---|
| 1A (comparative) | 30 wt. % fumed silica | N/A | 10-10.5 | 0 |
| 1B (comparative) | 30 wt. % fumed silica | 0.5 wt. % $H_2O_2$ | 10-10.5 | 46.5 |
| 1C (comparative) | 30 wt. % fumed silica | 1.0 wt. % $H_2O_2$ | 10-10.5 | 77.5 |
| 1D (comparative) | 30 wt. % fumed silica | 2.0 wt. % $H_2O_2$ | 10-10.5 | 69.75 |

TABLE 1-continued

| Polishing Composition | Abrasive Concentration | Oxidizer Concentration | pH | Silicon Carbide Removal Rate (nm/hr) |
|---|---|---|---|---|
| 1E (comparative) | 30 wt. % substantially spherical silica | N/A | 10 | 0 |
| 1F (invention) | 30 wt. % substantially spherical silica | 1 wt. % ammonium persulfate | 10 | 77.5 |
| 1G (invention) | 30 wt. % substantially spherical silica | 1 wt. % ammonium persulfate | 10 | 93 |
| 1H (invention) | 30 wt. % substantially spherical silica | 1 wt. % $KIO_3$ | 11 | 124 |
| 1I (invention) | 30 wt. % substantially spherical silica | 2 wt. % ammonium persulfate | 10 | 124 |
| 1J (invention) | 30 wt. % substantially spherical silica | 2 wt. % oxone | 10 | 93 |

As is apparent from the data presented in Table 1, the silicon carbide removal rate increases when the polishing composition comprises substantially spherical silica particles in combination with an oxidizing agent such as ammonium persulfate, potassium iodate, or oxone.

EXAMPLE 2

This example demonstrates the effect on the removal rate of silicon carbide by the presence of different oxidizing agents in the polishing composition of the invention.

A 4HN single crystal silicon carbide wafer was polished with seven different polishing compositions. Each of the polishing compositions contained 30 wt. % substantially spherical silica. Six of the polishing compositions were further modified by the addition of either ammonium persulfate or ammonium cerium nitrates as indicated in Table 2.

The silicon carbide removal rate (nm/hr) was determined for each polishing composition, and the results are shown in Table 2.

TABLE 2

| Polishing Composition | Oxidizer Concentration | pH | Silicon Carbide Removal Rate (nm/hr) |
|---|---|---|---|
| 2A (comparative) | N/A | 10 | 0 |
| 2B (invention) | 1 wt. % ammonium persulfate | 10 | 105 |
| 2C (invention) | 1 wt. % ammonium persulfate | 10 | 87.5 |
| 2D (invention) | 1 wt. % ammonium persulfate | 10 | 126 |
| 2E (invention) | 1 wt. % ammonium persulfate | 10 | 182 |
| 2F (invention) | 2 wt. % ammonium persulfate | 10 | 105 |
| 2G (invention) | 1 wt. % ammonium cerium nitrate | 1.7 | 126 |

As is apparent from the data presented in Table 2, the presence of either ammonium persulfate or ammonium cerium nitrate in the polishing composition increased the silicon carbide removal rate from 0 to as high as 182 nm/hr.

EXAMPLE 3

This example demonstrates the effect on the removal rate of silicon carbide by the presence of an oxidizer in a polishing composition.

A 4HPSI single crystal silicon carbide wafer was polished with three different polishing compositions. Each of the polishing compositions contained 30 wt. % substantially spherical silica and was adjusted to a pH of 10. Two of the polishing compositions were further modified by the addition of ammonium persulfate as indicated in Table 3.

The silicon carbide removal rate (nm/hr) was determined for each polishing composition, and the results are shown in Table 3.

TABLE 3

| Polishing Composition | Oxidizer Concentration | Silicon Carbide Removal Rate (nm/hr) |
|---|---|---|
| 3A (comparative) | N/A | 0 |
| 3B (invention) | 1 wt. % ammonium persulfate | 22.75 |
| 3C (invention) | 1 wt. % ammonium persulfate | 21 |

As is apparent from the data presented in Table 3, the silicon carbide removal rate increases when the polishing composition comprises ammonium persulfate.

EXAMPLE 4

This example demonstrates the effect on the removal rate of silicon carbide by the presence of an oxidizer and an abrasive in a polishing composition.

A 4H single crystal silicon carbide wafer was polished with fifteen different polishing compositions. The contents and pH of each of the polishing compositions are indicated below in Table 4. The silicon carbide removal rate (nm/hr) was determined for each polishing composition, and the results are shown in Table 4.

TABLE 4

| Polishing Composition | Abrasive Concentration | pH | Oxidizer Concentration | Silicon Carbide Removal Rate (nm/hr) |
|---|---|---|---|---|
| 4A (comparative) | 20 wt. % substantially spherical silica (Bindzil) | 10 | N/A | 76 |
| 4B (invention) | 20 wt. % substantially spherical silica (Bindzil) | 10 | 0.5 wt. % $H_2O_2$ | 105 |
| 4C (invention) | 20 wt. % substantially spherical silica (Bindzil) | 10 | 0.5 wt. % potassium periodate | 102 |
| 4D (invention) | 20 wt. % substantially spherical silica (Bindzil) | 10 | 0.5 wt. % potassium persulfate | 104 |
| 4E (comparative) | 20 wt. % substantially spherical silica (Nalco 1034) | 2 | N/A | 97 |
| 4F (comparative) | 20 wt. % substantially spherical silica (Nalco 1034) | 2 | 0.5 wt. % $H_2O_2$ | 96 |
| 4G (invention) | 20 wt. % substantially spherical silica (Nalco 1034) | 2 | 0.5 wt. % potassium periodate | 122 |
| 4H (invention) | 20 wt. % substantially spherical silica (Nalco 1034) | 2 | 0.5 wt. % potassium persulfate | 116 |
| 4I (comparative) | 0.5 wt. % ceria | 5 | N/A | 0 |
| 4K (comparative) | 0.5 wt. % ceria | 5 | 3000 ppm potassium periodate | 0 |
| 4L (invention) | 0.5 wt. % ceria | 5 | 3000 ppm potassium persulfate | 64 |
| 4M (comparative) | 7.5 wt. % g seeded gel process alpha alumina | 3 | N/A | 0 |
| 4N (invention) | 7.5 wt. % seeded gel process alpha alumina | 3 | 0.5 wt. % $H_2O_2$ | 37 |
| 4O (invention) | 7.5 wt. % seeded gel process alpha alumina | 3 | 0.5 wt. % potassium periodate | 59 |
| 4P (invention) | 7.5 wt. % seeded gel process alpha alumina | 3 | 0.5 wt. % potassium persulfate | 350 |

As is apparent from the data presented in Table 4, the silicon carbide removal rate typically increases upon the addition of an oxidizer to the polishing composition. The combination of seeded gel process alpha alumina with potassium persulfate was particularly effective in increasing the removal rate of silicon carbide.

EXAMPLE 5

This example demonstrates the effect on the removal rate of silicon carbide by the presence of different types of alumina abrasive in a polishing composition.

A 4H single crystal silicon carbide wafer was polished with six different polishing compositions. Each of the polishing compositions contained 3 wt. % abrasive and 1.0 wt. % potassium persulfate, and was adjusted to a pH of 3. The type of alumina abrasive used in each of the polishing compositions is indicated below in Table 5.

The silicon carbide removal rate (nm/hr) was determined for each polishing composition, and the results are shown in Table 5.

TABLE 5

| Polishing Composition | Alumina Type | Alumina Manufacturer | Average Particle Size (nm) | Silicon Carbide Removal Rate (nm/hr) |
|---|---|---|---|---|
| 5A (invention) | seeded gel process alpha | Saint Gobain (alpha) | <100 | 315 |
| 5B (invention) | fumed | Degussa (RMU3-11) | 120 | 109 |
| 5C (invention) | fumed | Cabot (RMWA-11) | 120 | 129 |
| 5D (invention) | polymer coated alumina | Cabot Microelectronics (TPA6) | 120 | 58 |

TABLE 5-continued

| Polishing Composition | Alumina Type | Alumina Manufacturer | Average Particle Size (nm) | Silicon Carbide Removal Rate (nm/hr) |
|---|---|---|---|---|
| 5E (invention) | alpha | Saint Gobain PN 7955.35 | 350 | 121 |
| 5F (invention) | alpha | Saint Gobain PN 7955.80 | 800 | 151 |

As is apparent from the data presented in Table 5, use of the seeded gel process alpha alumina resulted in a silicon carbide removal rate which was significantly larger than the rates achieved with the compositions containing other types of alumina.

EXAMPLE 6

This example demonstrates the effect on the removal rate of silicon carbide by the concentration of potassium persulfate in a polishing composition.

A 4HN single crystal silicon carbide wafer was polished with five different polishing compositions. Each of the polishing compositions contained 3 wt. % seeded gel process alpha alumina and was adjusted to a pH of 4. Four of the polishing compositions were further modified by the addition of potassium-persulfate.

The silicon carbide removal rate (nm/hr) was determined for each polishing composition, and the results are shown in Table 6.

TABLE 6

| Polishing Composition | Potassium Persulfate Concentration (wt. %) | Colloidal Stability | Silicon Carbide Removal Rate (nm/hr) |
|---|---|---|---|
| 6A (comparative) | 0 | stable | 15 |
| 6B (invention) | 0.002 | stable | 290 |
| 6C (invention) | 0.005 | stable | 336 |
| 6D (invention) | 0.03 | stable | 270 |
| 6E (invention) | 0.1 | unstable | 288 |

As is apparent from the data presented in Table 6, the silicon carbide removal rate continued to increase as the concentration of potassium persulfate increased up to a concentration between 0.005 wt. % and 0.03 wt. % potassium persulfate.

EXAMPLE 7

This example demonstrates the effect on the removal rate of silicon carbide by the concentration of seeded gel process alpha alumina in a polishing composition.

A 4HN single crystal silicon carbide wafer was polished with two different polishing compositions. Each of the polishing compositions contained 0.1 wt. % potassium persulfate and was adjusted to a pH of 4. The polishing compositions also contained seeded gel process alpha alumina at a concentration of either 0.1 wt. % or 0.5 wt. %.

The silicon carbide removal rate (nm/hr) was determined for each polishing composition, and the results are shown in Table 7.

TABLE 7

| Polishing Composition | Alumina Concentration (wt. %) | Silicon Carbide Removal Rate (nm/hr) |
|---|---|---|
| 7A (invention) | 0.1 | 213 |
| 7B (invention) | 0.5 | 288 |

As is apparent from the data presented in Table 7, although both compositions were effective in polishing the silicon carbide wafer, the composition containing the higher concentration of alumina achieved a higher silicon carbide polishing rate.

EXAMPLE 8

This example demonstrates the effect on the removal rate of several different types of silicon carbide wafers by a polishing composition.

Nine different types of single crystal silicon carbide wafers were polished with a polishing composition containing 0.6 wt. % seeded gel process alpha alumina and 0.03 wt. % potassium persulfate, adjusted to a pH of 4.

The silicon carbide removal rate (nm/hr) was determined for each type of wafer, and the results are shown in Table 8.

TABLE 8

| Silicon Carbide Wafer Type | Silicon Carbide Removal Rate (nm/hr) |
|---|---|
| 4HN | 282 |
| 6HPSI | 235 |
| 6HPSI | 222 |
| 6HPSI | 241 |
| 4HN | 322 |
| 6HPSI | 341 |
| 6HPSI | 358 |
| 6HPSI | 345 |
| 4HN | 316 |

As is apparent from the data presented in Table 8, the inventive polishing composition was able to successfully polish each type of silicon carbide wafer tested.

EXAMPLE 9

This example demonstrates the effect on the removal rate of silicon carbide by polishing a silicon carbide substrate using different polish tool parameters with a polishing composition.

Five different sets of polishing tool parameters were used to polish a chemical vapor deposition (CVD) polycrystalline silicon carbide wafer with a polishing composition containing 1 wt. % seeded gel process alpha alumina and 0.3 wt. % potassium persulfate, adjusted to a pH of 4.

The silicon carbide removal rate (nm/hr) was determined for each set of polishing conditions, and the results are shown in Table 9.

TABLE 9

| Polishing Conditions | Platen Speed (rpm) | Down Force (psi) | Silicon Carbide Removal Rate (nm/hr) |
|---|---|---|---|
| 9A (invention) | 60 | 0.96 | 63 |
| 9B (invention) | 60 | 2.87 | 221 |

TABLE 9-continued

| Polishing Conditions | Platen Speed (rpm) | Down Force (psi) | Silicon Carbide Removal Rate (nm/hr) |
|---|---|---|---|
| 9C (invention) | 100 | 2.87 | 655 |
| 9D (invention) | 120 | 4.78 | 978 |
| 9E (invention) | 120 | 4.78 | 982 |

As is apparent from the data presented in Table 9, the silicon carbide removal rate increased as the platen rotational speed of the polishing pad and the down force pressure of the substrate against the polishing pad were increased.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate, which method comprises:
(i) contacting a substrate comprising at least one layer of single crystal silicon carbide with a chemical-mechanical polishing composition comprising:
(a) a liquid carrier, wherein the liquid carrier with any components dissolved or suspended therein has a pH of about 5 or less,
(b) an abrasive suspended in the liquid carrier, wherein the abrasive consists of substantially spherical precipitated or condensation-polymerized silica particles having an average particle size of about 40 nm to about 130 nm, and
(c) an oxidizing agent selected from the group consisting of oxone, ammonium cerium nitrate, periodates, iodates, persulfates, and mixtures thereof,
(ii) moving the polishing composition relative to the substrate, and
(iii) abrading at least a portion of the silicon carbide of the substrate to polish the substrate.

2. The method of claim 1, wherein the abrasive is present in an amount of about 5 wt. % to about 40 wt. % based on the weight of the liquid carrier and any components dissolved or suspended therein.

3. The method of claim 2, wherein the abrasive is present in an amount of about 15 wt. % to about 35 wt. % based on the weight of the liquid carrier and any components dissolved or suspended therein.

4. The method of claim 3, wherein the liquid carrier comprises water, and the liquid carrier with any components dissolved or suspended therein has a pH of about 3 or less.

5. The method of claim 4, wherein the oxidizer is ammonium cerium nitrate.

6. The method of claim 5, wherein the oxidizer is present in the amount of 0.05 wt. % to about 2 wt. %.

7. The method of claim 4, wherein the oxidizer is potassium periodate.

8. The method of claim 7, wherein the oxidizer is present in the amount of 0.05 wt. % to about 2 wt. %.

9. The method of claim 4, wherein the oxidizer is potassium persulfate.

10. The method of claim 9, wherein the oxidizer is present in the amount of 0.05 wt. % to about 2 wt. %.

11. The method of claim 1, wherein the liquid carrier comprises water.

12. The method of claim 1, wherein the substantially spherical silica is condensation-polymerized silica.

13. The method of claim 1, wherein the oxidizing agent is present in an amount of about 0.01 wt. % to about 5 wt. % based on the weight of the liquid carrier and any components dissolved or suspended therein.

14. The method of claim 1, wherein the oxidizing agent is potassium periodate or potassium iodate.

15. The method of claim 1, wherein the oxidizer is potassium persulfate.

16. The method of claim 1, wherein the silicon carbide is removed from the substrate at a rate of about 30 nm/hr to about 1000 nm/hr.

17. The method of claim 16, wherein the silicon carbide is removed from the substrate at a rate of about 100 nm/hr to about 500 nm/hr.

18. The method of claim 1, wherein the liquid carrier with any components dissolved or suspended therein has a pH of about 3 or less.

19. The method of claim 18, wherein the liquid carrier with any components dissolved or suspended therein has a pH of about 2 or less.

20. The method of claim 1, wherein the oxidizing agent is present in an amount of about 0.001 wt. % to about 2 wt. % based on the weight of the liquid carrier and any components dissolved or suspended therein.

21. The method of claim 20, wherein the oxidizing agent is present in an amount of about 0.001 wt. % to about 0.5 wt. % based on the weight of the liquid carrier and any components dissolved or suspended therein.

22. The method of claim 1, wherein the single crystal silicon carbide is 4HN polytype.

23. The method of claim 1, wherein the single crystal silicon carbide is 6HPSI polytype.

* * * * *